United States Patent
Manna et al.

(10) Patent No.: US 11,550,984 B1
(45) Date of Patent: Jan. 10, 2023

(54) METHODS AND SYSTEMS FOR ANALOG CIRCUIT ANALYSIS

(71) Applicant: Dialog Semiconductor (UK) Limited, London (GB)

(72) Inventors: Indrajit Manna, Cheltenham (GB); Russell Christopher Giles, Southrop (GB); Peter Robert Bell, Wokingham (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 17/072,293

(22) Filed: Oct. 16, 2020

(51) Int. Cl.
*G06F 30/392* (2020.01)
*G06F 30/367* (2020.01)
(Continued)

(52) U.S. Cl.
CPC .......... *G06F 30/367* (2020.01); *G06F 30/327* (2020.01); *G06F 30/392* (2020.01); *G06F 30/398* (2020.01)

(58) Field of Classification Search
CPC .... G06F 21/6254; G06F 16/951; G06F 21/53; G06F 9/4881; G06F 9/5066; G06F 9/5044; G06F 9/5072; G06F 16/535; G06F 16/538; G06F 16/54; G06F 21/44; G06F 21/45; G06F 21/64; G06F 2209/503; G06F 2209/506; G06F 2221/2117; G06F 21/6218; G06F 16/24; G06F 30/327; G06F 16/29; G06F 16/9024; G06F 21/604; G06F 21/6245; G06F 30/30; G06F 40/279;
(Continued)

(56) References Cited

U.S. PATENT DOCUMENTS 6,308,300 B1 * 10/2001 Bushnell .............. G01R 31/316
716/136
9,614,540 B1 * 4/2017 Kull ...................... H03M 1/125
(Continued)

OTHER PUBLICATIONS

Wikipedia, Graph (abstract data type), Retrieved from https://en.wikipedia.org/w/index.php?title=Graph_(abstract_data_type)&oldid=1074929950, This page was last edited on Mar. 2, 2022, at 23:52 (UTC), 5 pages.
(Continued)

*Primary Examiner* — Binh C Tat
(74) *Attorney, Agent, or Firm* — Saile Ackerman LLC; Stephen B. Ackerman

(57) ABSTRACT

A method for analyzing an analog circuit controlled by a plurality of digital inputs is presented. The circuit is represented with a data structure with nodes connected via edges, which represent a circuit component. The data structure can be traversed across all connected nodes; and said digital inputs can be toggled between two or more input states. The method steps include identifying a set of boundary nodes in the data structure which are at a digital-analog boundary of the data structure; for each digital input, identifying associated boundary nodes which are coupled with the digital input; grouping digital inputs into input sets, where each of the different input sets are associated with mutually exclusive sets of associated boundary nodes, and analyzing the circuit by successively analyzing one or more of the input sets for all possible combinations of inputs states within that set.

27 Claims, 9 Drawing Sheets

(51) Int. Cl.
*G06F 30/398* (2020.01)
*G06F 30/327* (2020.01)

(58) Field of Classification Search
CPC .. G06F 40/30; G06F 11/3006; G06F 2115/02; G06F 30/33; G06F 30/34; G06F 30/392; G06F 40/44; G06F 8/443; G06F 11/1458; G06F 11/3409; G06F 12/1081; G06F 13/28; G06F 16/287; G06F 16/909; G06F 17/11; G06F 21/57; G06F 2212/621; G06F 3/0219; G06F 3/0233; G06F 3/0237; G06F 3/0238; G06F 30/3323; G06F 30/347; G06F 30/394; G06F 30/398; G06F 9/3017; G06F 9/3895; G06F 9/45558; G06F 9/4843; G06F 9/5016; G06F 9/544; G06F 1/206; G06F 11/0709; G06F 11/0757; G06F 11/0772; G06F 11/0793; G06F 11/301; G06F 11/302; G06F 11/3055; G06F 11/3058; G06F 11/3089; G06F 11/3419; G06F 11/3466; G06F 11/3476; G06F 11/3636; G06F 13/4022; G06F 13/4068; G06F 15/7807; G06F 16/1824; G06F 16/245; G06F 16/254; G06F 16/258; G06F 16/284; G06F 2009/45587; G06F 2009/45591; G06F 2009/45595; G06F 21/14; G06F 21/54; G06F 21/85; G06F 2115/10; G06F 2117/08; G06F 2119/10; G06F 2119/18; G06F 2201/815; G06F 2201/86; G06F 2201/865; G06F 2201/875; G06F 2209/5011; G06F 2209/502; G06F 2209/5021; G06F 2209/508; G06F 2221/033; G06F 2221/2149; G06F 3/0604; G06F 3/0605; G06F 3/061; G06F 3/0614; G06F 3/0631; G06F 3/0649; G06F 3/0653; G06F 3/0664; G06F 3/067; G06F 3/0685; G06F 30/20; G06F 30/27; G06F 30/32; G06F 30/367; G06F 30/3953; G06F 40/166; G06F 40/20; G06F 40/205; G06F 40/242; G06F 40/247; G06F 40/40; G06F 8/433; G06F 8/60; G06F 9/44505; G06F 9/453; G06F 9/4893; G06F 9/5038; G06F 9/505; G06F 9/5061; G06F 9/5083; G06F 9/5088; G06F 9/5094; G06F 9/541; G06F 9/542; G06F 9/547; H04N 19/12; H04N 19/124

USPC .......................... 320/100–106; 716/100–106
See application file for complete search history.

(56) References Cited

U.S. PATENT DOCUMENTS

| | | | |
|---|---|---|---|
| 10,970,441 B1* | 4/2021 | Zhang | G06N 3/0472 |
| 2009/0112564 A1* | 4/2009 | Schmieder | G06F 30/3323 |
| | | | 703/21 |
| 2012/0074918 A1* | 3/2012 | Shimomura | H05B 45/325 |
| | | | 323/282 |
| 2012/0188109 A1* | 7/2012 | Sanduleanu | H03M 1/1061 |
| | | | 341/120 |
| 2016/0285470 A1* | 9/2016 | Leuschner | H03M 1/66 |
| 2019/0013819 A1* | 1/2019 | D'Alessio | H03F 3/005 |
| 2021/0021448 A1* | 1/2021 | Beukema | H04L 25/0272 |

OTHER PUBLICATIONS

Spectre Tech Tips: Spectre High Impedance Node Check Overview, Amaninder, Jul. 29, 2021, 5 pages, found: https://community.cadence.eom/cadence_blogs_8/b/cic/posts/spectre-tech-tips-spectre-high-impedance-node-check-overview. Copyright Cadence Design Systems, Inc.

Co-pending U.S. Patent DS21-047G, "A Method for Identifying a Leakage Current Path in a Circuit," U.S. Appl. No. 17/719,828, filed Apr. 13, 2022, Peter Bell et al., 24 pages.

* cited by examiner

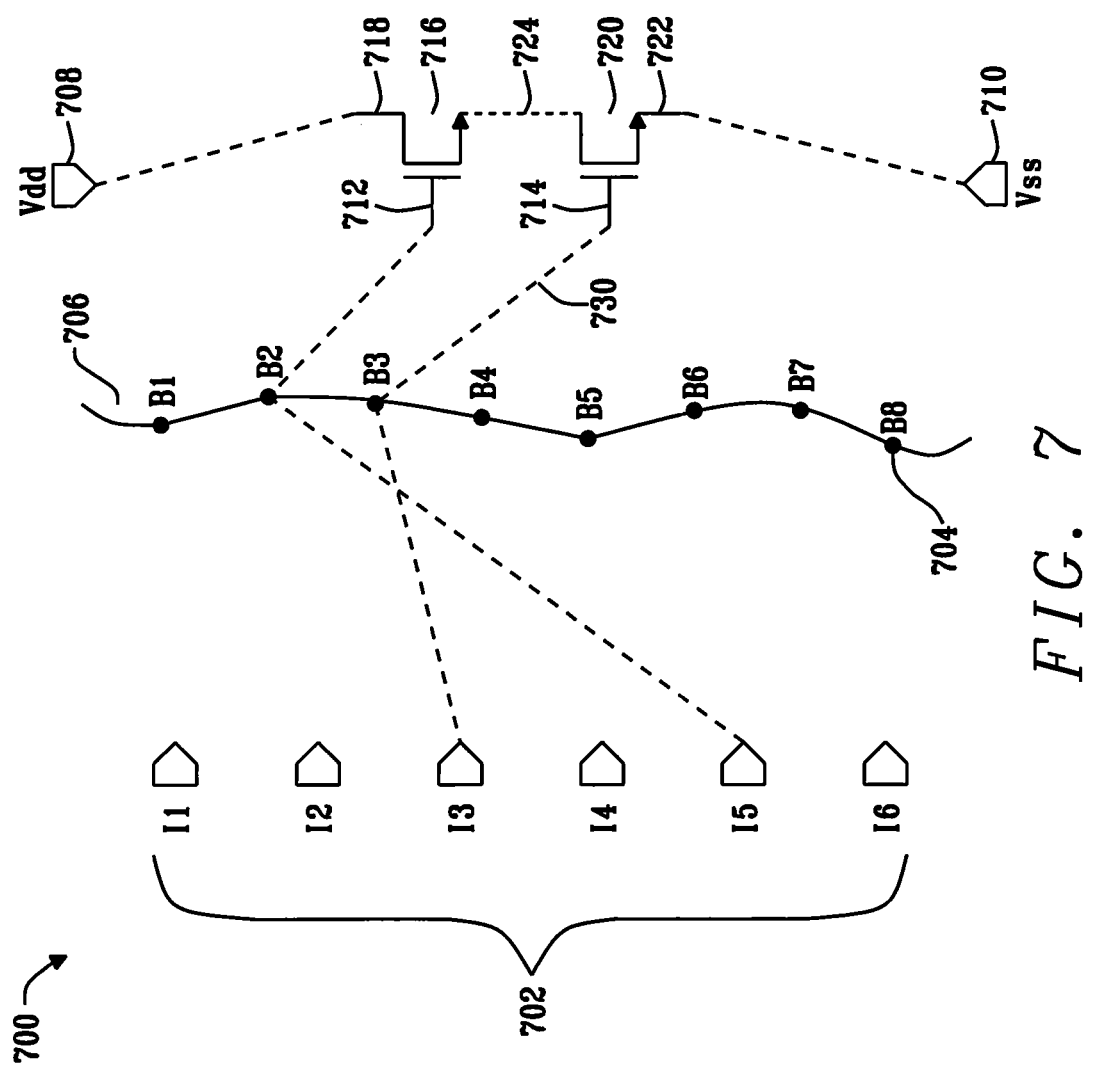

METHODS AND SYSTEMS FOR ANALOG CIRCUIT ANALYSIS

TECHNICAL FIELD

The present disclosure relates to method and system for circuit analysis and in particular for methods and systems for analyzing an analog circuit controlled by a plurality of digital inputs.

BACKGROUND

Modern analogue circuits are often controlled by a large number of digital inputs which can be toggled between two or more input states. In a medium-sized circuit block with a few thousand nodes, the number of digital inputs which control the block can easily be in the order of hundreds This poses a serious challenge for circuit analysis or testing. Circuits may need to be analyzed or tested for various reasons, such as for detecting any dynamic or conditional floating nodes, or more generally for determining under which conditions a certain circuit event occurs. A comprehensive analysis would require testing all possible combinations of input states. However, since the number of input combinations to test grows exponentially with the number of inputs to be toggled it is often impossible to exhaustively test all the possible combinations of input states.

An example of a test is the detection of dynamic or conditional floating nodes. Existence of such floating nodes may depend on a specific combination of inputs, which is often hard to identify among the very large number of possible combinations of inputs.

For simple circuits, design knowledge and peer review may be sufficient to identify combinations of input states which may be critical for the event or issue under examination, such as for causing floating nodes. However, this approach is not scalable to the number of digital inputs present in a modern electronic chip. Moreover, the input combinations to achieve a given functionality of a circuit are often quite different from the input combinations that may trigger a defect. For instance, defects such as floating nodes are often a problem when the circuit is disabled (inactive) but still powered up, drawing only leakage current. Therefore, any design knowledge of how the circuit works in its functional mode is often irrelevant for predicting the input combinations to detect a floating node. Furthermore, there are often scenarios where additional use modes of a design requiring unforeseen combinations of input states are identified only after the testing of the circuit. Therefore it would be beneficial if all possible combinations of input states could be tested for defects, such that the design would not suffer from unforeseen combinations even when new use modes are devised after the initial design and testing phase of a chip.

Current state-of-the-art simulation techniques used in circuit verification are computationally expensive and have prohibitively long runtimes, which generally makes it impossible to test all possible combinations of input states. Even the fastest simulations/tests can present a challenge with a relatively small number of inputs. For example, running a 1 s long test over all combinations resulting from just 25 inputs would take in excess of a year. Most modern circuits have 100 or more inputs and some types of test can take minutes or even hours.

SUMMARY

The lack of a tool for comprehensively testing or analyzing an analog circuit controlled by a large number of digital inputs is a big issue for the fast paced modern electronic industry in which the design/verification windows for chip is increasingly compressed and pressure to achieve first pass silicon success continues to grow. For example, a floating node that occurs only under a specific input combination may escape detection before tape-out if random input combinations are used to trigger such floating nodes, Therefore, a great demand exists for automated methods and systems which do not require any significant design knowledge and which allow to reduce the number of combinations of input states that needs to be tested It is an object of the disclosure to address one or more of the above-mentioned limitations.

According to a first aspect of the disclosure there is provided a method for analyzing an analog circuit controlled by a plurality of digital inputs, wherein said circuit is represented with a data structure comprising a plurality of nodes connected via edges; where each node represents a node of the circuit, each edge represents a circuit component, and wherein the data structure can be traversed across all connected nodes; and said digital inputs can be toggled between two or more input states; said method comprising: identifying a set of boundary nodes in the data structure which are at a digital-analog boundary of the data structure; for each digital input, identifying associated boundary nodes which are coupled with the digital input; grouping digital inputs into input sets, where each of the different input sets are coupled with mutually exclusive sets of associated boundary nodes; and analyzing the circuit by successively analyzing one or more of the input sets for all possible combinations of inputs states within that set.

Optionally, the method comprises receiving an input circuit design and transforming the circuit design to said data structure.

Optionally, the input circuit design comprises a netlist or other circuit structure description.

Optionally, transforming the circuit design comprises flattening the netlist to a set of primitive circuit components.

Optionally, the input circuit design further comprises a list of supply connected nodes.

Optionally, the supply connected nodes comprise at least one high power supply port and at least one low power supply port.

Optionally, the data structure comprises a graph and traversing the data structure comprises crawling the graph.

Optionally, the data structure comprises a node connectivity representation which comprise any one of: adjacency matrix, adjacency list, and an edge list.

Optionally, analyzing an input set for all possible combinations of inputs states within that set comprises updating the data structure for each different combinations of input states.

Optionally, analyzing an input set for all possible combinations of inputs states within that set comprises: i) setting all digital inputs which are not in said input set to a fixed input state; ii) analyzing the circuit for all possible combinations of input states within the said input set; iii) repeating i) and ii) for all possible fixed input states.

Optionally, identifying a set of boundary nodes in the data structure comprises: traversing the data structure in all possible directions from each digital input; and for each direction identifying a first traversed node which is not in a digital-only section of the circuit.

Optionally, identifying the first traversed node which is not in a digital-only section of the circuit comprises identifying the first traversed node which is connected to a device which does not belong to a logic circuit component.

Optionally, the device is a switch device.

Optionally, the switch device comprises a transistor.

Optionally, identifying a set of boundary nodes in the data structure further comprises: for each traversed node, identifying a list of devices connected to said traversed node; and when a device is found which does not belong to a logic circuit component, the traversal in the direction of said device is aborted and the node is identified as a boundary node.

Optionally, the input circuit design further comprises a list of supply connected nodes; each device comprises a first terminal and a second terminal; and identifying a set of boundary nodes in the data structure further comprises: for each device which belongs to a logic cell, identifying the first and second terminal of said device; then, if any of said terminals are connected to any of the supply connected nodes, aborting the traversal in the direction of said device; otherwise continuing the traversal.

Optionally, a node is coupled to a digital input if a traversal path can be traced in the data structure from the digital input to said node.

Optionally, if no associated boundary nodes are identified for a given digital input, the digital input is excluded from the analyzed combinations of inputs states.

Optionally, grouping digital inputs into input sets where each of the different input sets are coupled with mutually exclusive sets of associated boundary nodes comprises: a) initializing mutually exclusive input sets and sets of associated boundary nodes respectively; b) recursively updating the initialized input sets and sets of associated boundary nodes by merging input sets whose elements are associated with associated boundary nodes which belong to the same set of associated boundary nodes and by merging sets of boundary nodes whose elements are associated with digital inputs of a same input set; c) repeating step b) until the input sets and the sets of associated boundary nodes stop growing.

Optionally, grouping digital inputs into input sets, further comprises: i) for each boundary node, grouping the digital inputs associated to said boundary node into an input set; ii) for each input set, grouping the boundary nodes associated with any input in the input set into a set of associated boundary nodes; iii) for each set of associated boundary nodes, identifying inputs which are associated to any boundary node in the set of associated boundary nodes and merging all input sets which comprise said inputs; and iv) repeating step ii) and iii) until the input sets and the sets of boundary node stop growing.

Optionally, the method further comprises, for each boundary node, interrogating the data structure to find dependent analog nodes which are dependent on said boundary node.

Optionally, analyzing the circuit comprises identifying critical nodes.

Optionally, the method further comprises identifying untested critical nodes in the circuit; identifying sets of interacting nodes among the untested critical nodes; for each set of interacting nodes, back-traversing the data structure from the interacting nodes in the set of interacting nodes to the digital inputs and creating new input sets; and analyzing the circuit by successively analyzing each new input sets for all possible combinations of input states within that set.

Optionally, the critical nodes comprise problematic floating nodes.

Optionally, the input circuit design further comprises a list of supply connected nodes; a node is identified as a floating node if it is not coupled with any supply connected node; and a floating node is identified as problematic if it can provide a leakage path.

Optionally, one circuit component is represented by a plurality of edges where each of the edges represents a different control path through the component.

According to a second aspect of the disclosure there is provided a system for analyzing an analog circuit, wherein the system comprises: a data structure representing the circuit, the data structure comprising a plurality of nodes connected via edges, where each node represents a node of the circuit, each edge represents a circuit component, and wherein the data structure can be traversed across all connected nodes; and a plurality of digital inputs which control the analog circuit, wherein each digital input can be toggled between two or more input states; the system being configured to: identify a set of boundary nodes in the data structure which are at a digital-analog boundary of the data structure; for each digital input, identify associated boundary nodes which are coupled with the digital input; group digital inputs into input sets, where each of the different input sets are coupled with mutually exclusive sets of associated boundary nodes; and analyze the circuit by successively analyzing one or more of the input sets for all possible combinations of inputs states within that set.

The system of the second aspect may also incorporate using or providing features of the first aspect and various other steps as disclosed herein.

BRIEF DESCRIPTION OF THE DRAWINGS

The disclosure is described in further detail below by way of example and with reference to the accompanying drawings, in which:

FIG. 7 is a schematic diagram illustrating the working of a back-tracing step of the method of FIG. 6;

DESCRIPTION

Figure 1:
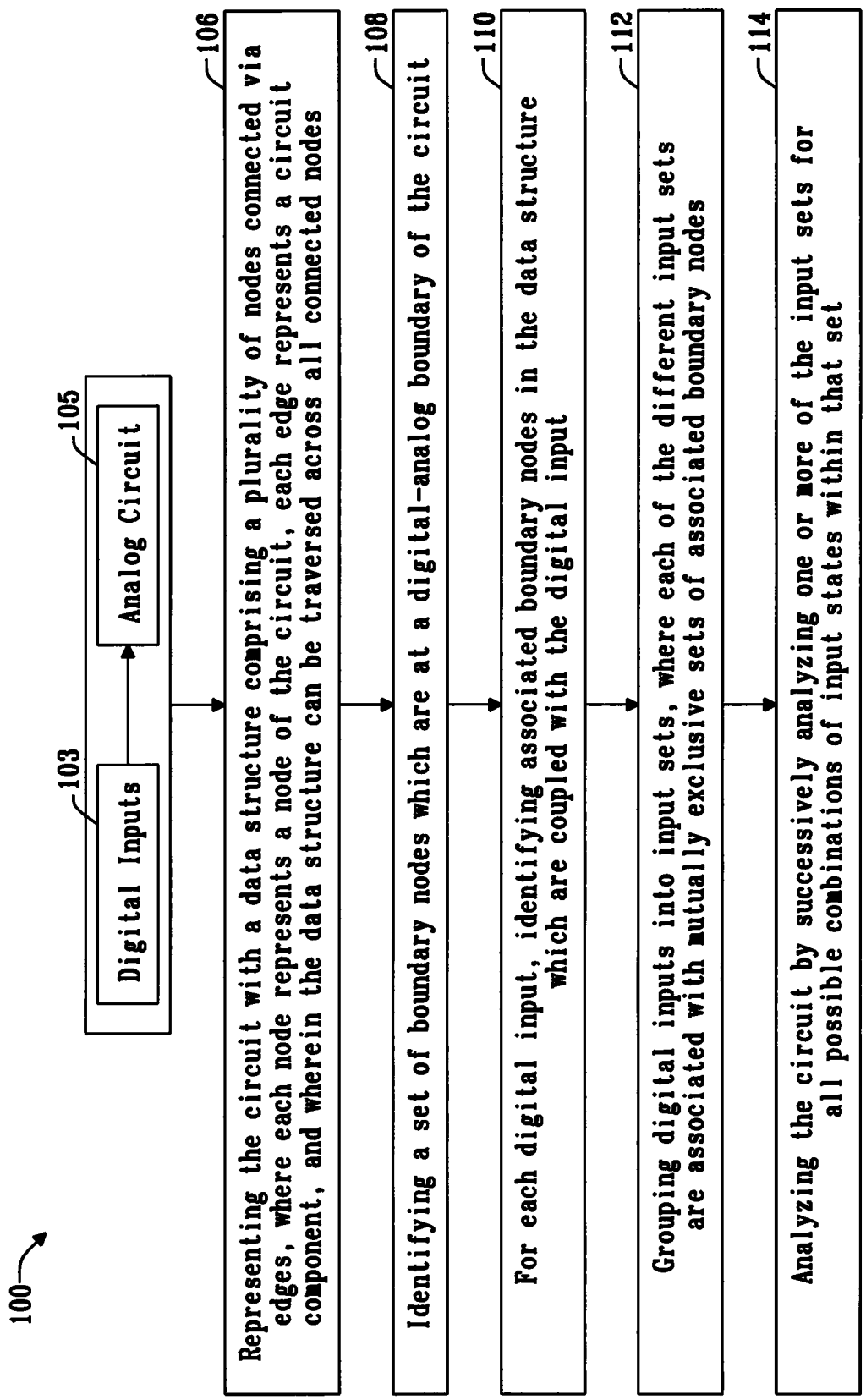
FIG. 1 is a schematic diagram of a method according to a first aspect of the present disclosure for analyzing an analog circuit controlled by a plurality of digital inputs.

FIG. 1 is a schematic diagram of a method 100 according to a first aspect of the present disclosure for analyzing an analog circuit 105 controlled by a plurality of digital inputs 103 which can be toggled between two or more input states.

At step 106 the circuit is represented with a data structure comprising a plurality of nodes connected via edges; where each node represents a node of the circuit, each edge represents a circuit component, and wherein the data structure can be traversed across all connected nodes. At step 108, a set of boundary nodes which are at a digital-analog boundary of the circuit 105 is identified. At step 110, for each digital input 103, associated boundary nodes in the data structure which are coupled with the digital input are identified. At step 112, the digital inputs 103 are grouped into input sets where each of the different input sets are associated with mutually exclusive sets of associated boundary nodes (hereinafter also referred to as boundary sets for brevity). At step 114, the circuit is analyzed by successively analyzing one or more of the input sets for all possible combination of input states within that set.

The digital inputs 103 may be for example digital input ports which can be toggled between two logic states 0 and 1 and which are used to provide functionality such as to control transistors or switches in the circuit. The state of the digital inputs 103 may be driven by registers or non-volatile memory settings. Different combinations of input states may result in different connections between the circuit components and therefore analyzing an input sets for all possible combination of input states within that set may comprise updating the data structure for each possible combination.

Advantageously, the method 100 may provide for the transformation of an existing recorded circuit design to have the form of the data structure of the disclosure. A circuit analysis tool may receive an input circuit design and apply the transformation to create a data structure with the appropriate properties. The input circuit design may comprise a netlist, which is a known structured text or other circuit description listing all the components of the circuit and the nodes that they are connected to.

Circuit components are generally represented in a netlist as cells or blocks having one or more terminals. The components may be for example logic cells from a standard cell library, transistors, resistors, capacitors, integrated circuit chips, and so on. For each type of components, multiple instances will generally be present in a circuit.

The netlist may comprise both primitive and non-primitive circuit components and in some embodiments the method 100 may comprise flattening the netlist to a set of primitive components.

The input may further comprise a list of supply connected nodes. In some embodiments the supply connected nodes comprise at least one high power supply port and at least one low power supply port. For example, the power supply port may be a voltage port. Hereinafter the high and low power supply ports may also be referred to as Vdd and Vss respectively.

The data structure may comprise a node connectivity representation which may comprise any of an adjacency matrix, adjacency list, and an edge list and may be constructed in various ways. For example, the data structure may comprise an associative array in which the keys are the nodes' names and the value of each key is a connectivity list of device component terminals connected to it.

In some embodiments, the data structure comprises a circuit graph and interrogating the data structure comprises crawling the circuit graph via one or more crawling episodes.

Figure 2:
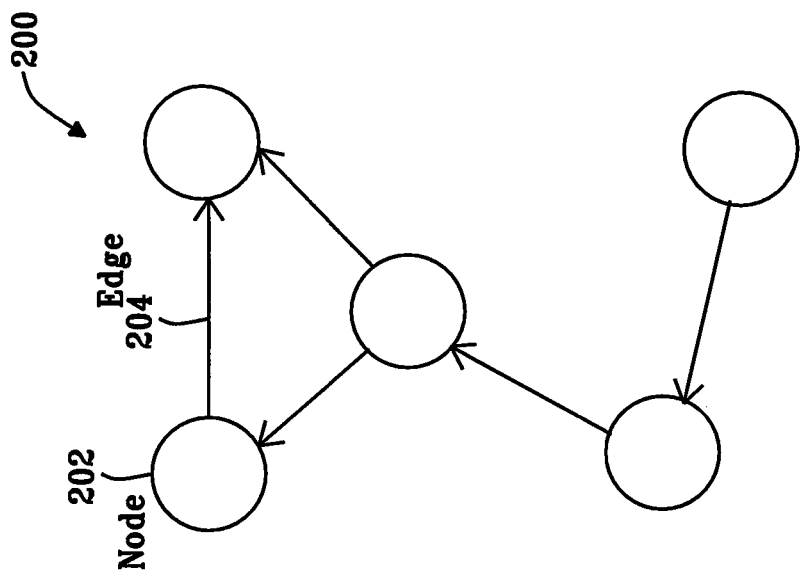
FIG. 2 shows an example of data structure representing a circuit and for use in the methods and system of the present disclosure.

An example of data structure comprising a circuit graph is shown in FIG. 2. The data structure 200 comprises a plurality of nodes 202 connected via edges 204. The nodes may be alternatively referred to as vertices or points, and the edges may be alternatively referred to as links or lines. Each node 202 represents a circuit node such as a terminal of a circuit component, and each edge 204 represents a circuit component. One circuit component may be represented by a plurality of edges wherein each of the edges represents a different electrical path through the component. In some embodiments, the edges 104 are directed edges, as shown by the arrows in the figure, with the directionality representing a direction of current flow or decreasing voltage. The direction of a specific edge 204 can change as the input conditions of the circuit change, e.g. due to the digital inputs being toggled.

When traversing to find boundary nodes, we are looking for the nodes that are controlled by a specific primary digital input. Since gate of a transistor controls its source and drain, whenever we encounter a gate we traverse through its source and drain (two separate child paths) and continue onwards. Note that we are following the direction of control to find the dependent nodes and the boundary nodes (for a specific primary digital input). This is not the same as the current flow direction because there is no current flow between gate and source/drain of a transistor.

The graph structure does not change as it still represents electrical connectivity. For example, two nodes of the graphs are connected only if there is an electrical connection between them (either via a resistance or a transistor that is turned on). Because, we also keep the information of the device terminals, this allows us to traverse the control direction from a gate to source/drain by merging the graph connectivity information and the device terminal information, The data structure 200 can be configured. For example, edges between nodes can be modified, added or removed based on the value at another node.

The data structure is created so that it can be traversed across all connected nodes. A traversal is a journey (also referred to as an episode) that starts at a certain node, follows the edges outgoing from that node, reaches another node (and so on) and finally reaches a destination node. The direction of the traversal follows a direction of control, which is a path following a sequence of events reflecting the control or effect that one node has on a subsequent node. The direction of control does not have to coincide with the direction of current flow, and may be going against the direction of the edges or along the direction of the edges. For example, a traversal may start from an input node and at a certain point encounter the gate of a transistor. The traversal would then continue following the nodes connected to said transistor's source and drain, even though no current is flowing between the gate and the source/drain of the transistor, since the gate controls what happens to the source and drain.

Traversing the data structure may be achieved by a data processing system provided with instructions which can trace a path through successive nodes in the structure.

Figure 3:
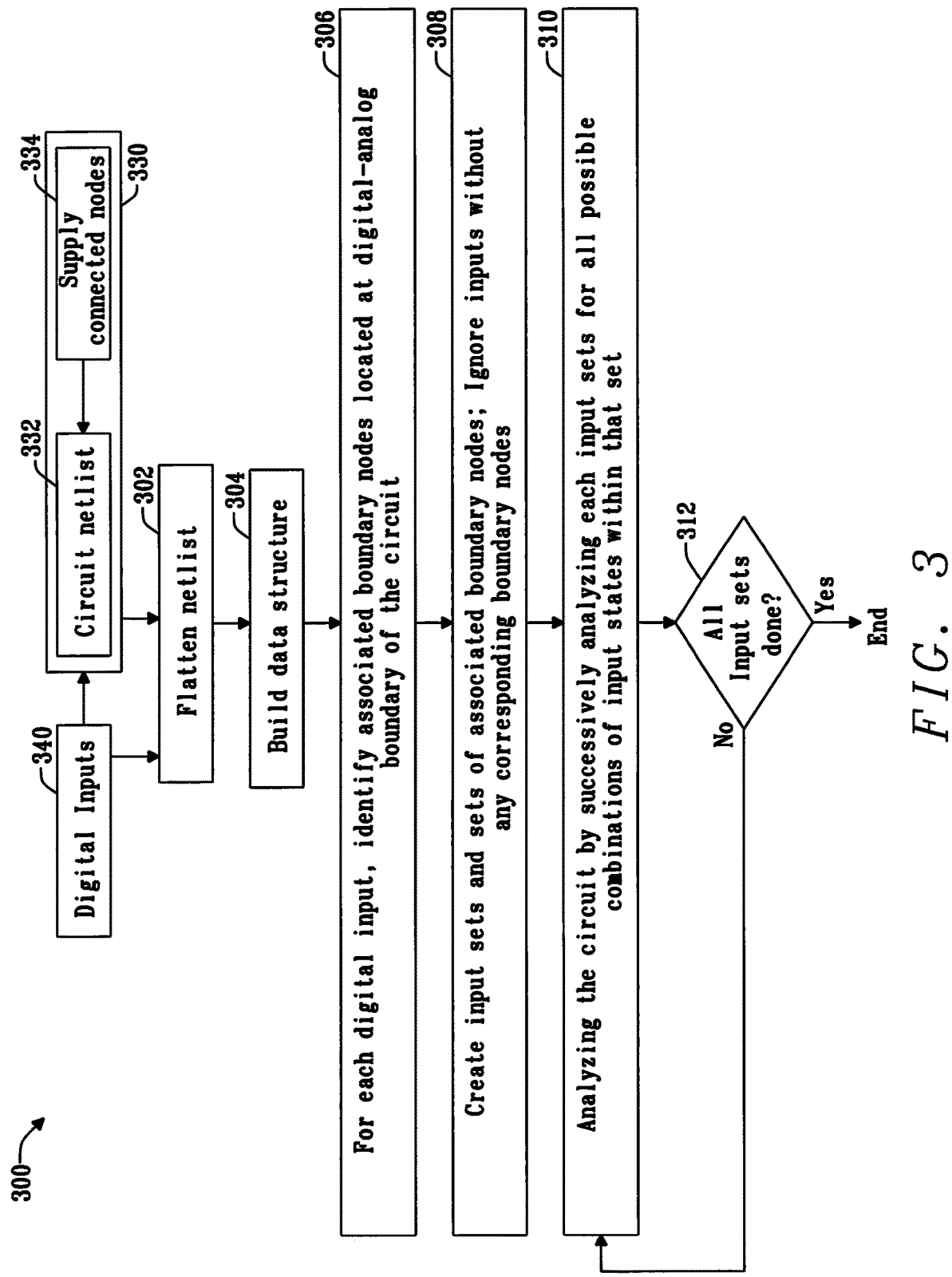
FIG. 3 is a flow chart of a method 300 for analyzing an analog circuit according to one illustrative specific example of an embodiment of the present disclosure.

FIG. 3 is a flow chart of a method 300 for analyzing an analog circuit according to one illustrative specific example of an embodiment of the present disclosure.

A circuit design input 330 and a list of digital inputs 340 which are used to configure and control the circuit are provided. The circuit design input 330 comprises a netlist 332 and a list of supply connected nodes 334. The list of supply connected nodes 334 may comprise a high power supply port Vss and a low power supply port Vdd.

At step 302, the netlist 332 is flattened so that the netlist only comprises primitive components. It will be appreciated that in other embodiments the netlist may not be fully flattened or may not be flattened at all.

At step 304, a data structure representing the circuit is built. In particular, in this specific embodiment the data structure comprises a node connectivity representation which contains all the node connectivity information of the circuit.

At step 306, for each primary digital input, associated boundary nodes which are at a digital-analog boundary of the circuit are identified. This may be done by traversing the data structure in all possible directions from each digital input and, for each direction, identifying a first traversed node which is not in a digital-only section of the circuit.

It will be appreciated that step 306 may be implemented in various ways and that different criteria may be used to define the boundary between the digital-only section of the circuit and the rest of the circuit. For example, identifying the first traversed nodes which are not in a digital-only section of the circuit may comprise identifying the first traversed node which is connected to a predetermined type of device and wherein said device does not belong to a digital logic circuit component or digital logic cell. Typically, in circuit design the logic components of the circuit are sourced from a pre-defined logic cell library which comprises components such as NAND gates, NOR gates, inverters, and so on, and the boundary nodes are identified as the first nodes traversed from each input in any direction which are connected to at least a switch device, wherein the switch device does not belong to one of such logic cells. The switch device may be for example a transistor having a first terminal or source, a second terminal or drain and a control terminal or gate and determining whether the transistor belongs to a logic cell may comprise looking at each terminal to check whether the nodes which they are coupled to are within the logic cell boundaries. However, connection to a different type of device and more generally a different rule may be used as a criteria for identifying boundary nodes.

It will further be appreciated that although the circuit section entered once the digital-analog boundary is crossed may be referred to as analog section for simplicity, further logic cells may still be encountered. Nodes connected (exclusively or not) to these logic cells would then be considered to be part of the analog section. For the purpose of the present disclosure the digital-analog boundary is identified by the first encounter of a node (in the traversal path starting from a primary digital input) that has at least one connection to a device which not part of a standard cell library. Any subsequent logic gates downstream to said first node are ignored for the purpose of identifying the digital-analog boundary and are considered to be inside the analog section.

At step 308 input sets are created and each of the different input sets are associated with a mutually exclusive set of associated boundary nodes. Each digital input can have one or more associated boundary nodes and each boundary node can be associated to one or more digital inputs. This forms the basis for the creation of the input sets and boundary sets.

The input sets provide a partition of the digital inputs for use in the analysis of the circuit. In preferred embodiments, the partition is such that the input sets are as large as possible whilst being mutually exclusive, since this minimizes the number of input combinations which need to be analyzed for achieving maximum coverage of circuit node analysis.

The step 308 may be implemented in various ways. For example, the step 308 may comprise the steps of:
a) initializing mutually exclusive input sets and sets of associated boundary nodes respectively;
b) updating the initialized input sets and sets of associated boundary nodes by merging input sets whose elements are associated with associated boundary nodes of a same set of associated boundary nodes and by merging sets of boundary nodes whose elements are associated with digital inputs of a same input set;
c) repeating step b) until the input sets and the sets of associated boundary nodes stop growing.

For applications that are concerned with testing only analogue portion the circuit (such as finding floating nodes), inputs that are not associated with any analog-digital boundary nodes can be removed from the input combinations to be tested At step 310, the circuit is analyzed by successively analyzing each input set for all possible combinations of input states within that set, wherein the step comprises updating the node connectivity representation of the circuit for each different combination of input states within the set.

Once all input sets have been analyzed (step 312) the method terminates. Analyzing the circuit for all possible input combinations within each input sets provides exhaustive test pattern for analyzing the circuit while keeping the number of input combinations to be tested at a reasonable level.

Digital inputs will usually have two possible input states, though it will be appreciated that the disclosure can be extended to work with digital inputs with more than two input states. For N digital inputs wherein each input can be toggled between M states, the number of possible combination would be $M^N$. In this scenario, the methods and systems according to the present disclosure would allow to reduce the total number of input combinations which need to be tested to achieve comprehensive coverage of the circuit to a maximum of $$T = \sum_{i=1}^{P} M^{N_i}$$

P being the number of sets of digital input; $N_i$ being the number of inputs in each set, where $$\sum_{i=1}^{P} M^{N_i};$$

and T being lower than $M^N$, generally by a very large margin.

In particular, if the digital inputs can be toggled between M states, for an input set comprising $N_i$ digital inputs, where $$\sum_{i=1}^{P} N_i = N \text{(total number of digital inputs)},$$

only $M^{Ni}$ input combinations would need to be tested. For a scenario in which there are P input sets, each comprising $N_{qI}$ input states, with i=1 . . . P being an integer index, the total number of combinations to be tested would then be:

$$\sum_{i=1}^{P} M^{N_i}$$

This is a considerably lower number than NM, the total number of input combinations which would need to be tested in principle in order to achieve comprehensive coverage of the circuit without applying the methods of the present disclosure.

In some embodiments, step 310 comprises setting all the inputs which are not in the input set under analysis to a fixed input state and the method may comprise analyzing each input set as many time as there are input states.

For example, for a circuit controlled by digital inputs which can be toggled between two states 1'b0 and 1'b1, the step 310 may comprise the following steps:

Setting all inputs not in the input set under analysis to 1'b0;

Analyzing the circuit for all possible input combinations in the input set under analysis;

Set all inputs not in the input set under analysis to 1'b1;

Analyzing the circuit for all possible input combinations in the input set under analysis.

The method 300 may further comprises storing all input combinations already tested in a memory so that they are not tested again.

Figure 4:
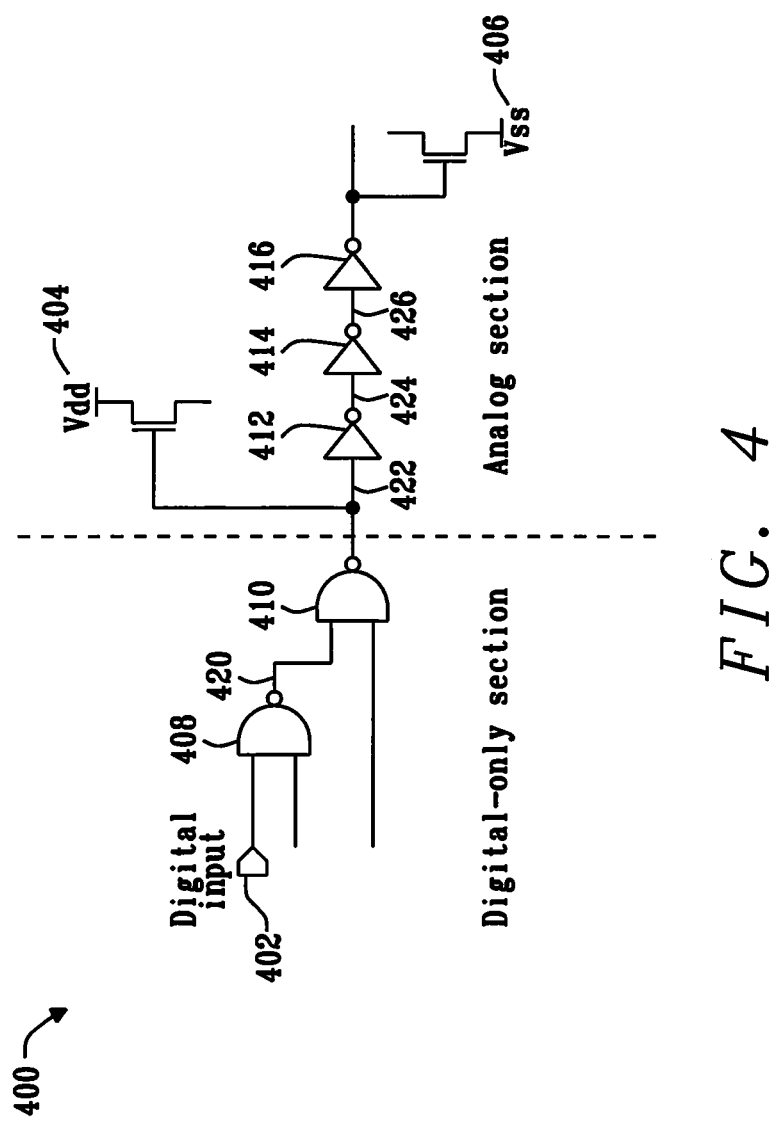
FIG. 4 is a schematic diagram illustrating how a boundary nodes identification step of the method of FIG. 3 may be implemented.

The identification of the digital-analog boundary at step 306 of method 300 may be implemented in various ways. FIG. 4 is a schematic diagram illustrating in more detail how the boundary nodes identification step 306 may be implemented in a portion of a node connectivity representation 400.

The node connectivity representation 400 represents a section of a simple digitally controlled analog circuit comprising a digital input 402, a high power supply port 404, a low power supply port 406 and standard logic cells 408, 410, 412, 414 and 416.

The node connectivity representation is traversed from the digital input 402 in the direction of logic cell 408. So long as the most recently visited node in the path remains exclusively connected to switch devices which belong to logic cells from the pre-defined standard cell library, such as node 420, the node is considered to be inside a digital-only section of the circuit. The first time the traversal encounters a node which has at least one connection to a switch device outside any logic cell from the pre-defined standard cell library, such as node 422, the node is identified as a boundary node. Any node connected to a logic cell (from the predefined standard cell library) encountered after the boundary node 422, such as nodes 424 and 426, are considered to be analog nodes dependent on the boundary node 422.

In details, the search for boundary nodes may comprise the following steps:

a) Starting at a primary digital input and initializing a list of traversed nodes;

b) Identifying a list of devices connected to said digital input;

c) Checking if all of the devices in b) belong to a logic cell: if a device is found that does not belong to a logic cell from the pre-defined logic cell library, abort the traversal in the direction of said device and identify the node as a boundary node associated to said digital input; otherwise identify the terminals of each device connected to the node;

d) For each device which belongs to a logic cell from the pre-defined logic cell library, if any of the terminals identified at step c) is coupled to one of the supply connected nodes, abort the traversal in the direction of that device; otherwise continue the traversal by repeating steps b) to e) for each node which the terminals of the device are connected to.

For each traverse node, the node is added to the list of traversed nodes so that it is not traversed again. When no more nodes can be traversed, the traversal ends. The list of boundary nodes associated with the digital input is saved for use in later steps and the procedure is repeated for the next digital input.

If no boundary nodes are identified when traversing the data structure from a given digital input, then the digital input may be excluded from the combinations of input states to be tested.

Figure 5:
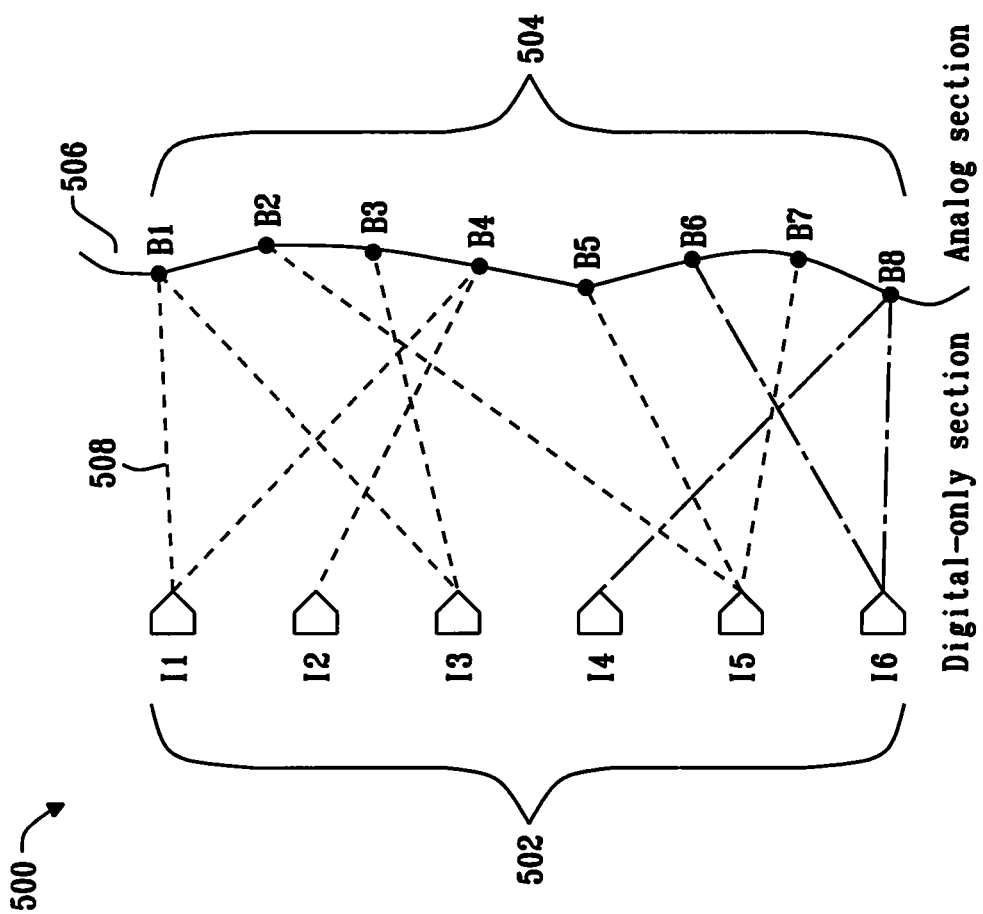
FIG. 5 is a schematic diagram illustrating how input sets and boundary sets may be created in a step of the method of FIG. 3.

FIG. 5 is a schematic diagram illustrating how the input sets and the boundary sets may be created at step 306.

FIG. 5 shows a portion of a node connectivity representation 500 which comprise six digital inputs 502, labelled I1 through to I6 and eight boundary nodes 504 located at a digital-analog boundary 506. The boundary nodes 504 are labelled B1 through to B8 and have been identified according to the methods of the present disclosure. Each of the digital input 502 has one or more associated boundary nodes which are coupled with the digital input, wherein a boundary node is said to be coupled with a digital input if a traversal path can be traced in the data structure from the digital input to said node. The boundary nodes associated with each digital input may be identified as part of step 306 as explained with reference to FIG. 4. The associations between the boundary nodes and the digital input are shown in FIG. 5 by dashed line 508. For example, the digital input I1 has associated boundary nodes B1 and B4; the digital input I2 has associated boundary node B4; the digital input I3 has associated boundary nodes B1 and B3 and so on.

Starting from the node connectivity representation 500, the creation of the input sets and boundary sets may be implemented as follows:

i) for each boundary node, grouping the digital inputs associated to said boundary node into an input set;

ii) for each input set, grouping the boundary nodes associated with any input in the input set into a set of associated boundary nodes;

iii) for each set of associated boundary nodes, identifying digital inputs which are associated to any boundary node in the set of associated boundary nodes and merging all input sets which comprise said inputs;

v) repeating step ii) and iii) until the input sets and the sets of boundary nodes stop growing.

It will be appreciated that the order in which the boundary nodes are selected in step i) is not relevant. In some embodiments, the boundary node which is coupled to the largest number of digital input may be chosen first and in case of a tie, the tie may be broken randomly. For example, in FIG. 5 B1, B4 and B9 are all coupled to two digital inputs and any of the three, say B1, may be chosen as starting boundary node. It will also be appreciated that different steps may be adopted in order to achieve the same results. For example, the method may start by grouping boundary nodes associated to a each digital input in step i) rather than by grouping digital inputs associated with a given boundary nodes, as follows:

i) for each digital input, grouping the boundary nodes associated with said input into a boundary set;

ii) for each boundary set, grouping the digital inputs associated to any boundary note in boundary set into an input set;

iii) for each input set, identifying associated boundary nodes which are coupled to any digital input in the input set and merging all boundary sets which comprise said associated boundary nodes;

iv) repeating step ii) and iii) until the input sets and boundary sets stop growing.

The above method may be implemented by an algorithm which receives in input a master input list comprising the inputs 502 and a master boundary node list comprising the boundary nodes 504.

The algorithm may then loop through the master list of boundary node and for each boundary node initialize two list i) and ii): a first list is for adding digital inputs (list-1) and a second list is for adding boundary nodes (list-2) that are associated with at least one member of list-1. Initially list-2 contains one boundary node and list-1 contains the list of input(s) that are associated to this boundary node. For example, in FIG. 5 list-1 for the boundary node B1 would comprise I1 and I3 and list-2 would comprise B1 at initialization time. For each input in list-1 the master list of boundary nodes can then be searched to identify boundary nodes that are coupled with it and list-2 is updated with all such boundary nodes. Redundancies are removed such that each node or input appears only once in each list. With reference again to the lists for boundary node B1, the inputs I1 and I3 in list-1 are associated to B1 and B4 and to B1 and B3 respectively, therefore list-2 would comprise B1, B3, B4. For each new boundary node added to list-2 the master list of inputs is searched to identify input associated with the boundary node. Said inputs are added into list 1 and redundancies are removed. For example, in FIG. 5 the node B4 is also associated with I2 and therefore I2 would be added to list-1, which becomes I1, I2, I3. Each time a digital input or boundary node is added to a list, they are removed from the master list of inputs and boundary nodes.

By iterating this process until list-1 and list-2 stop growing, a first input set {I1, I2, I3} and a first set of associated boundary nodes {B1, B3, B4} are created. At this point the algorithm repeats select a new boundary node in the master list of boundary nodes and repeats all the steps. When both the master lists are empty the algorithm terminates.

In the example of FIG. 5, the final input sets and sets of associated boundary nodes would be:

Input set 1: {I1, I2, I3}; boundary set 1: {B1, B3, B4}
Input set 2: {I4, I6}; boundary set 2: {B6, B8}
Input set 3: {I5}; boundary set 3: {B2, B5, B7}.

The input sets and boundary sets identified with the methods according to the present disclosure substantially allow to identify which set, or cluster, of boundary nodes is controlled by a given set or cluster, of input.

In some embodiments, the method 300 may further comprise interrogating the data structure to find dependent analog nodes which are dependent on each boundary node. Interrogating the data structure to find dependent analog nodes may comprise the following steps:

selecting a starting boundary node;
initializing a list of visited nodes, said list comprising at first only the starting boundary node;
identifying all devices connected to the node via a first terminal, a second terminal or a control terminal, where the first and second terminal may be for example a source or drain terminal for a transistor or a 'plus' or 'minus' terminal for a resistor and the control terminal may be for example a gate terminal for a transistor or a bulk terminal for a resistor;
for all devices which are connected to the starting boundary node via a control terminal, identifying a first and a second terminal of said device; then if either the first or second terminal are connected to a high power supply port or a low power supply port, or if either of the first or second terminal is connected to a terminal node which is in the list of visited node, stop the traversal and pass to the next connected device; otherwise continue the traversal and add the terminal node to the list of visited node;
for all devices which are connected to the starting boundary node via the first or second terminal, identifying the second or first terminal respectively; then, if said the identified terminal is connected to either a high power supply port or a low power supply port or if the identified terminal is connected to a terminal node which is in the list of visited node, stop the traversal and pass to the next device; otherwise continue the traversal and add the terminal node to the list of visited node;
iterate the above steps until no more nodes can be traversed. The list of nodes visited is the list of dependent analogue nodes for the starting boundary node.

By continuing the traversal of the data structure from the boundary nodes deeper down in the analog section of the circuit, it is possible to identify sets, or clusters, of dependent analog nodes which are dependent on a given set of boundary nodes. Hence, the methods and system of the present disclosure allow to break down the whole circuits in blocks or areas of influence which are under the influence or control of specific sets of digital inputs. Note that as previously mentioned, analog nodes in the so-called analog section may comprise nodes which are exclusively connected to a logic cell so long as the logic cell is located downstream from the digital-analog boundary with respect to the digital inputs.

This enables a high coverage analysis of the circuit behavior at any point in the circuit. For example, one may want to identify critical nodes in a circuit where a certain event occurs. An example of event may be the circuit node being at a specific voltage, or being crossed by a specific current or triggering a specific event and so on. If the event under examination is of such nature that its occurrence depends on the digital input states, a comprehensive behavior analysis would require testing all possible combinations of digital input states. However, with the methods and systems of the present disclosure it is possible to break down the circuit into clusters of nodes where each cluster is controlled by a specific set of digital inputs and where each cluster is substantially independent from the inputs which control other clusters. Then it is possible to analyze each clusters of inputs independently whilst still achieving a comprehensive circuit analysis.

This may be particularly beneficial for the detection of defects within the analog circuit. An example is the detection of floating nodes. Note that the floating node detection is only provided as an example to illustrate the technique for a specific use case and is not meant to restrict its usage. In an electric or electronic circuit, a floating node is a node which is not driven to a defined high or low level. In some instances, floating nodes may be considered harmless; however floating nodes are often undesirable since they can cause problems, such as leakage currents in downstream logic circuits, noise coupling and generally unpredictable and unreliable circuit behaviors. Rectification of floating nodes which are problematic is necessary for correct circuit behavior and is often expensive in terms of time and money, especially when they are identified late in the design process or after silicon is fabricated; therefore, it is desirable to be able to identify and rectify any floating nodes in a circuit as early as possible. Floating nodes are often "dynamic", that is they may become de-coupled from the power supplies during operation due, for example, to a specific input configuration. This means that in order to comprehensively detect floating nodes in a circuit controlled by a plurality of digital inputs and determine whether they are problematic, all possible input combinations must be taken into account. Modern circuits typically comprise hundreds of boundary nodes and, for each boundary node, hundreds of analog nodes dependent on the boundary node which may all be candidate floating nodes under certain input conditions. By breaking down the circuit into clusters of analog nodes which are controlled by a boundary node, and therefore by a specific input set, the present disclosure provides a way to reduce the number of combinations that needs to be tested in order to detect floating nodes whilst maintaining high coverage.

The methods described with reference to FIGS. 3 to 5, allow to achieve high coverage of problematic floating node detection, or more generally of critical nodes detection. However, since the input sets and boundary sets are grouped based on the coupling between the inputs and the boundary nodes and not based on the analog nodes themselves, there is a small chance that analog nodes dependent on different boundary nodes, and therefore controlled by different input sets, interact to provide a critical node. With reference to the specific application of floating node detection, a floating node may be defined problematic if under certain conditions the floating node can provide a leakage path. In certain circuits, it is possible that two floating nodes which are associated with different input sets and which are not problematic by themselves interact to provide such leakage path, typically because of two or more transistors controlled by said nodes providing said leakage path. Note that the example of floating node induced leakage path is provided as an illustration only. This technique is applicable to any test case that target to achieve high level of node coverage in an analogue circuit. Then, analyzing the circuit by successively analyzing one or more of the input sets for all possible combinations of inputs states within that set may not be sufficient to detect all such problematic floating nodes.

Figure 6:
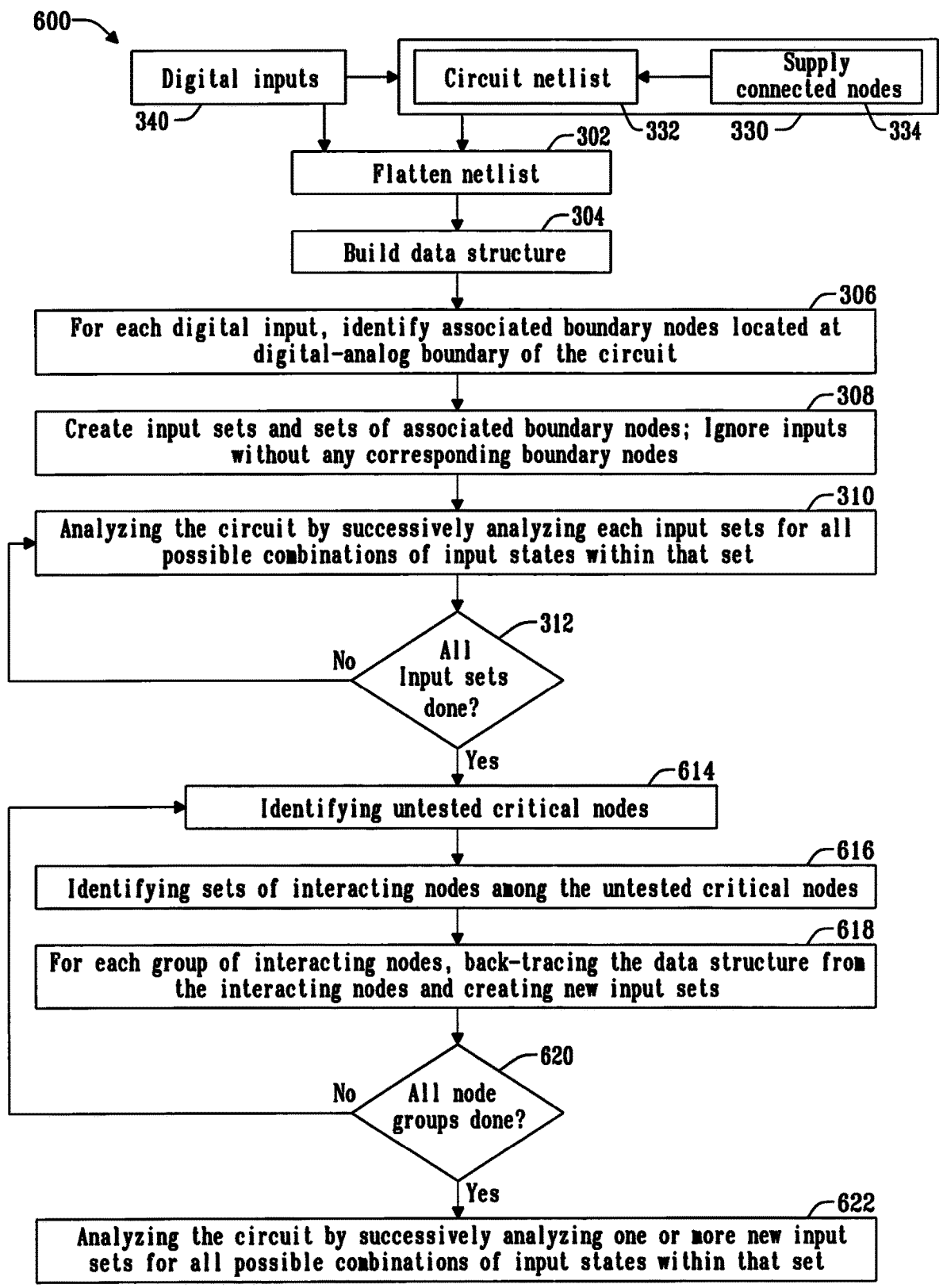
FIG. 6 is a flow chart of a method 600 according to a further specific example of an embodiment of the present disclosure.

This can be remedied by back-tracing the data structure from critical nodes in the analog section of the circuit and identifying new input sets to be analyzed, as shown in FIG. 6.

FIG. 6 is a flow chart of a method 600 according to a specific embodiment of the present disclosure. The method 600 comprises all the steps of the method 300 and further steps for back-tracing the data structure from critical analog nodes. Common features between figures in this disclosure are represented by common reference numerals/variables.

The method 600 comprises: at step 614, identifying untested critical nodes; at step 616, identifying sets of interacting nodes among the untested critical nodes; at step 618 for each sets of interacting nodes, back-tracing the data structure from the interacting nodes to the digital inputs and creating new input sets; once all group of interacting nodes have been selected (step 620), analyzing the circuit by successively analyzing each new input sets for all possible combinations of input states within that set (step 622). Optionally, the method 300 comprise saving all tested combinations of input states in a memory and all new input sets are analyzed for all possible combinations of inputs states within the set which have not yet been analyzed.

Step 618 may comprise: for each set of interacting nodes, back-tracing the data structure to the boundary nodes which the interacting nodes are dependent on; back-tracing the data structure from each of these boundary nodes to all digital inputs that they are associated to and creating a new input set comprising said input. Step 618 may further comprise looking up the input sets created at step 308 to identify which new input sets had already been analyzed and discard any only retain new input sets not previously analyzed. It will be appreciated that in some embodiments the sets of clusters of analog nodes dependent on each boundary node may be stored in a memory and therefore back-tracing the data structure from the interacting node to the boundary nodes would simply comprise looking-up the stored information to identify to which clusters of dependent analog nodes each interacting node belongs to.

In a specific application, the method 600 is used for the analysis of problematic floating nodes. In the present application, candidate floating nodes are defined as nodes that have a likelihood of being floating nodes due to their position in the data structure representing the circuit, such as nodes which are connected to the gate of at least one transistor; and untested critical nodes, or untested candidate floating nodes, are defined as candidate floating nodes for which no input combination has yet been found which can stimulate a leakage path because of said candidate floating node.

A list of untested critical nodes can be provided according to any method known to the person skilled in the art, such as methods as disclosed in U.S. Ser. No. 17/019,851 which is hereby incorporated by reference in its entirety. From such list, sets of interacting nodes can be identified as follows:

A. An initial node is picked from the list of untested critical nodes and added to a first set of interacting nodes.

B. All transistors which may be turned on by the initial node are identified. These may be all the transistor with the gate terminal connected to the initial node.

C. For each identified transistor, all neighboring transistors that have a conduction path to a high power supply port or to a low power supply port are identified. A neighboring transistor may be defined as one that shares a source or a drain terminal (but not a gate terminal) with the transistor under consideration. A conducting path is defined as any conducting electrical path obtained by traversing the data structure. In particular, a conducting path may be defined as a path obtained by traversing transistors that are permanently in a conducting state or other low-resistance devices.

D. For each neighboring transistor, the node connected to its gate node terminal, hereinafter referred to as gate node, is identified.

E. If said gate node is also a member of the list of untested critical nodes, the gate node is added to the initial node in the set of interacting nodes and removed from the list of untested critical nodes.

F. The steps A through to E are repeated for each node in the list of untested critical nodes.

The above steps basically allow to determine whether any transistors controlled by two or more untested critical nodes are coupled via a conducting path. If such a conducting path exists, then the input combinations must be tested to check whether an input combination exists that triggers one or more of those nodes in such a way that a leakage path or an undesirable circuit behaviour is formed through the transistors controlled by those nodes.

Once the sets of interacting nodes have been identified, the data structure can be back-traced from the interacting floating nodes in order to identify the boundary nodes that all the interacting critical nodes in a set of interacting nodes are dependent on. For each such boundary node, the data structure is further back-tracked to identify the specific digital inputs that the boundary node is coupled to. All digital inputs identified in this way and which were originally included in the same input set, are grouped into a new input set which can be analyzed for all possible combinations of input states within the new input set. After back-tracing from interacting critical nodes, a set of primary digital inputs are identified that control this set of critical nodes. If this group of primary digital inputs is already part of the input clusters from step 308, they are discarded. If such a group was not part of clusters from step 308, a new input cluster is formed and all possible combination of input states within the new input set are exercised on the circuit.

FIG. 7 is a schematic diagram illustrating the working of the back-tracing step in a data structure 700.

The data structure 700 comprises six digital inputs 702, labelled I1 through to I6 and eight boundary nodes 704, labelled B1 through to B8, which are located at a digital-analog boundary 706. The data structure further comprises a high power supply port 708 (Vdd), a low power supply port 710 (Vss), and two untested critical nodes 712 and 714. The first untested critical node 712 is connected to the control gate of a first transistor 716 which has a drain terminal 718 coupled to the high power supply port 708; the second untested critical node 714 is connected to a second transistor 720 which has a source terminal 722 coupled to Vss. The first transistor further has a source terminal coupled to a drain terminal of the second transistor at a node 724.

The first and second untested critical nodes are in different blocks of the circuit and are dependent on different boundary nodes, respectively B2 and B3, however they share a common node 724. Due to their connections, the first and second untested critical nodes may provide a leakage path and are identified as interacting nodes.

The data structure is therefore back-traced as shown via dashed lines 730 from nodes 712 and 714 to the boundary nodes which they are dependent on, in this specific example node B2 and B3 respectively, and from the boundary nodes to all digital inputs that such boundary nodes are associated with, in this instance I3 and I5. Since I3 and I5 do not belong to the same input set (not shown), their corresponding combinations of input states have not been considered in the circuit analysis. Therefore, a new input set comprising I3 and I5 is created and all possible input combinations within the new input set which have not previously been considered are examined.

It will be appreciated that a user may select any number of input combinations out of all the possible input combinations within each input set, depending on the level or coverage required in the circuit analysis. In preferred embodiments, all possible input combinations within each input set are selected.

The methods and systems according to the present disclosure allow to minimize the number of input combinations that must be tested in order to achieve the target coverage level in a circuit analysis thereby saving analysis time and resources. The coverage level of the analysis is preserved despite the number of tested input combinations being minimized since the methods according to the present disclosure allow to identify input combinations which provide the highest impact on the digitally controlled analog circuit under examination The methods and systems of the present disclosure work for any type of circuit since they are not technology dependent, and can be applied to any type of circuit analysis or testing The methods and systems of the present disclosure can be used in a wide range of scenarios and in conjunction with both proprietary and commercial tools.

Moreover, the methods of the present disclosure allow to speed up circuit analysis when an architecture change is applied to a circuit by making use of results already available from previous tests. For example, if a design change in a circuit suddenly causes some inputs to become coupled to a new area of the circuit and start affecting nodes in that part of the circuit, the input set would be updated to move such digital inputs to the relevant input sets which are associated with the nodes in that part of the circuits. However, for a comprehensive circuit analysis it would not be necessary to re-analyze all input sets, but just the ones that have changed. Similarly, if a certain block of an analogue circuit is no longer controlled by some digital inputs due to a design change, the corresponding input set automatically shrinks reducing the number of input combinations available within the set but only the input sets which have changed would need to be analyzed again. No user intervention or design knowledge is necessary to keep up with changes in the internal architecture/connectivity and update the number of input combinations required to achieve high coverage. The methods and systems according to the present disclosure automatically maximize verification efficiency by always providing the inputs sets with the highest impact on the associated circuit blocks The methods of the present disclosure may also be used for improving a circuit design. For example, the list of input sets determined by back-tracing the data structure from interacting nodes provides an indirect measure of interactions between unrelated parts or blocks of the circuit. Therefore, the list of input sets may be used as a metric to minimize such interactions and improve modularity of the circuit design (where practicable) regardless of what type of testing or analysis the circuit is undergoing.

The methods and system of the present disclosure may also be used to provide a model validation with respect to circuit schematics for blocks with large number of digital inputs. Often, when the circuit is controlled by a large number of inputs, a constrained number of random input combinations are tested, which only allows to achieve limited model validation. By using the methods and systems according to the present disclosure, a large input domain can be broken up into reasonably sized input sets which can then be tested exhaustively providing much better coverage of the circuit behavior than by testing random combinations.

Figures 8A, 8B:
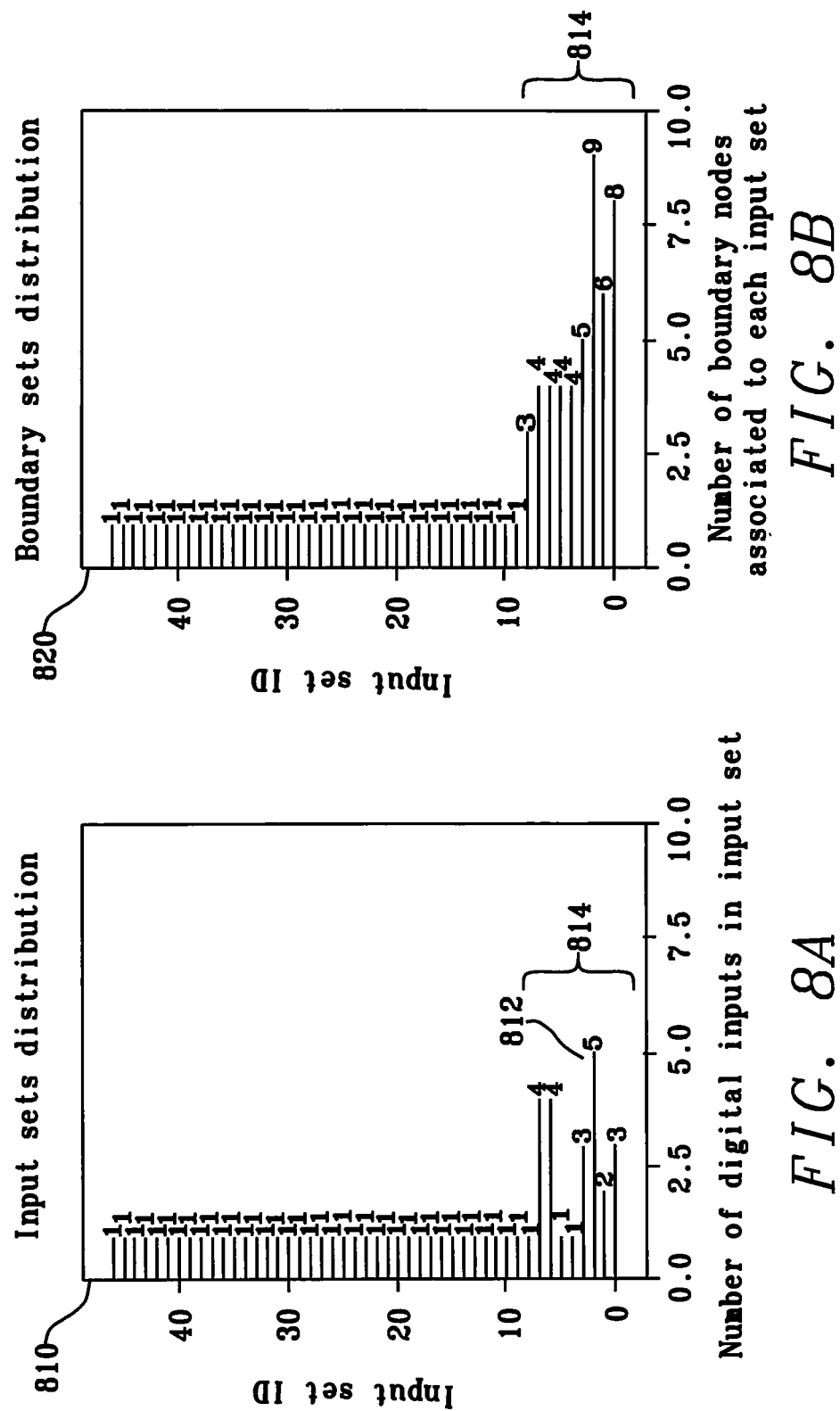
FIGS. 8A and 8B show the results of a test 800 in which the methods of the present disclosure are applied.

FIGS. 8A and 8B show the results of a test 800 in which the methods of the present disclosure are applied. The test 800 was run on a 3300-node analogue circuit with 98 digital binary inputs which was being inspected for dynamic floating nodes. An exhaustive analysis which takes into account all possible inputs states combinations would have required $2^{98}$ combinations to be tested. By employing the methods according to the present disclosure, 36 of the 98 digital inputs were found to have no-impact on the circuit because they had no digital-to-analog boundary nodes coupled to them. These inputs were set to 1'b0 and not considered in any combination. The remaining 62 digital inputs were grouped into input sets by implementing the methods according to the present disclosure. The resulting sets, or clusters, are shown FIG. 8A in the graph 810 wherein the y axis shows the cluster ID and the x axis shows the number of digital inputs in each input set. In total, 47 input sets were identified, with the largest cluster 812 containing 5 digital inputs. By creating exhaustive combinations of the inputs within each input set, only 166 test combinations were found.

For each input set, the corresponding number of boundary nodes associated to the set was determined. This is shown in FIG. 8B in the graph 820, wherein the y axis shows the input set ID and the x axis shows the number of boundary nodes associated to each input set. While most input sets only controlled one boundary node, some sets 814 were labelled as "high-impact" since they control a relatively large number of boundary nodes.

All possible combinations of interacting floating nodes were identified and by back-tracing, or back-traversing, the circuit data structure from the interacting floating nodes to the digital inputs, a further 12 combinations of digital inputs to be analyzed were identified, giving a total of 178 input combinations to consider. The analysis of these 178 input combinations led to 100% detection of all the floating nodes known in the circuit design under examination, including interacting floating nodes.

It will be appreciated that in different embodiments the steps of the above methods may be executed in different order and that the stated steps do not preclude the presence or addition of one or more other steps.

Figure 9:
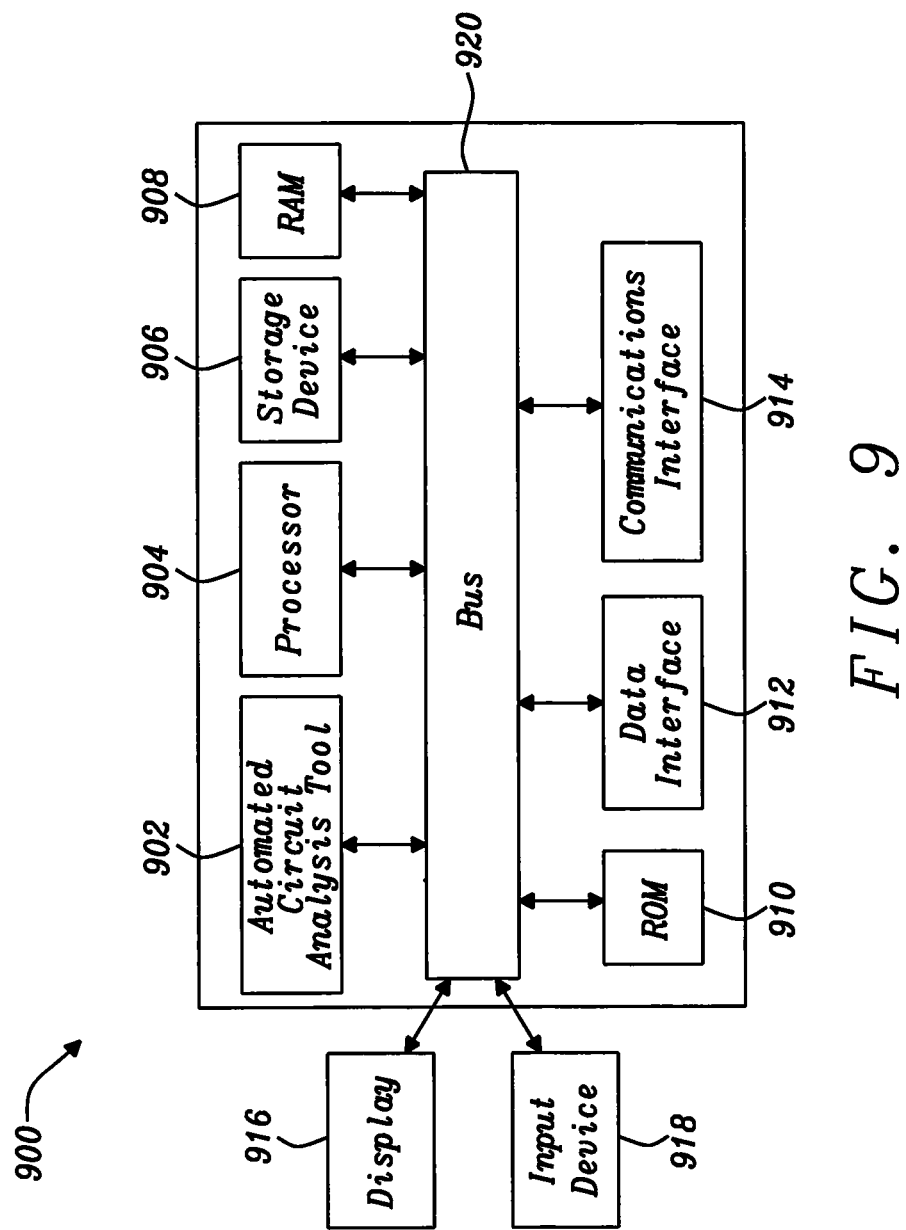
FIG. 9 is a schematic diagram of a computer system which comprises specially modified components for carrying out the methods of this disclosure, in accordance with a second aspect of the present disclosure.

FIG. 9 is a schematic diagram of a computer system 900 which comprises specially modified components for carrying out the methods of this disclosure, in accordance with a second aspect of the present disclosure.

The computer system 900 comprises a module 902 which is configured as an automated circuit analysis tool configured to implement the methods of the present disclosure.

The computer system 900 may comprise a processor 904, a storage device 906, RAM 908, ROM 910, a data interface 912, a communications interface 914, a display 916, and an input device 918. The computer system 900 may comprise a bus 920 to enable communication between the different components.

The computer system 900 may be configured to load an application. The instructions provided by the application may be carried out by the processor 904. The application may be the automated circuit analysis tool.

A user may interact with the computer system 900 using the display 916 and the input device 918 to instruct the computer system 900 to implement the methods of the present disclosure in the analysis of a circuit.

In conclusion, the methods and systems according to the present disclosure provide an automated way to significantly reduce the combinations of input states which are required to test a digitally controlled analogue circuits while maintaining excellent node coverage and without requiring any significant design knowledge. The methods and system according to the present disclosure can be applied for instance, to reduce the number of input combinations that needs to be analyzed when testing for dynamic floating nodes in a circuit design.

What is claimed is:

1. A computer implemented method for analyzing the behavior of an analog circuit controlled by a plurality of digital inputs, wherein
   said analog circuit is represented with a data structure comprising a graph comprising a plurality of nodes connected via edges, where each node of the graph represents a node of the analog circuit, each edge of the graph represents a circuit component, and wherein the data structure can be traversed across all connected nodes; and
   said digital inputs can be toggled between two or more input states;
said method comprising:
   identifying a set of boundary nodes in the data structure which are at a digital-analog boundary of the data structure;
   for each digital input, identifying associated boundary nodes which are coupled with the digital input;
   grouping digital inputs into input sets, where each of the different input sets are coupled with mutually exclusive sets of associated boundary nodes; and
   analyzing the behavior of the analog circuit by successively analyzing one or more of the input sets for all possible combinations of input states within that set.

2. The method of claim 1 wherein the method comprises receiving an input circuit design and transforming the circuit design to said data structure.

3. The method of claim 2 wherein the input circuit design comprises a netlist or other circuit structure description.

4. The method of claim 3 wherein transforming the circuit design comprises flattening the netlist to a set of primitive circuit components.

5. The method of claim 3 wherein the input circuit design further comprises a list of supply connected nodes.

6. The method of claim 5 wherein the supply connected nodes comprise at least one high power supply port and at least one low power supply port.

7. The method of claim 1 wherein traversing the data structure comprises crawling the graph.

8. The method of claim 1 wherein the data structure comprises a node connectivity representation which comprise any one of: adjacency matrix, adjacency list, and an edge list.

9. The method of claim 1 wherein analyzing an input set for all possible combinations of inputs states within that set comprises updating the data structure for each different combinations of input states.

10. The method of claim 9 wherein analyzing an input set for all possible combinations of inputs states within that set comprises:
   i) setting all digital inputs which are not in said input set to a fixed input state;
   ii) analyzing the circuit for all possible combinations of input states within the said input set;
   iii) repeating i) and ii) for all possible fixed input states.

11. The method of claim 1 wherein identifying a set of boundary nodes in the data structure comprises
   traversing the data structure in all possible directions from each digital input; and
   for each direction identifying a first traversed node which is not in a digital-only section of the circuit.

12. The method of claim 11 wherein identifying the first traversed node which is not in a digital-only section of the circuit comprises identifying the first traversed node which is connected to a device which does not belong to a logic circuit component.

13. The method of claim 12 wherein the device is a switch device.

14. The method of claim 13 wherein the switch device comprises a transistor.

15. The method of claim 11 wherein identifying a set of boundary nodes in the data structure further comprises
   for each traversed node, identifying a list of devices connected to said traversed node; and
   when a device is found which does not belong to a logic circuit component, the traversal in the direction of said device is aborted and the node is identified as a boundary node.

16. The method of claim 15 wherein the input circuit design further comprises a list of supply connected nodes; each device comprises a first terminal and a second terminal; and identifying a set of boundary nodes in the data structure further comprises for each device which belongs to a logic cell, identifying the first and second terminal of said device; then, if any of said terminals are connected to any of the supply connected nodes, aborting the traversal in the direction of said device; otherwise continuing the traversal.

17. The method of claim 1 wherein a node is coupled to a digital input if a traversal path can be traced in the data structure from the digital input to said node.

18. The method of claim 1 wherein if no associated boundary nodes are identified for a given digital input, the digital input is excluded from the analyzed combinations of inputs states.

19. The method of claim 1 wherein grouping digital inputs into input sets where each of the different input sets are coupled with mutually exclusive sets of associated boundary nodes comprises
   a) initializing mutually exclusive input sets and sets of associated boundary nodes respectively;
   b) recursively updating the initialized input sets and sets of associated boundary nodes by merging input sets whose elements are associated with associated boundary nodes which belong to the same set of associated boundary nodes and by merging sets of boundary nodes whose elements are associated with digital inputs of a same input set;
   c) repeating step b) until the input sets and the sets of associated boundary nodes stop growing.

20. The method of claim 19 wherein grouping digital inputs into input sets, further comprises:
   i) for each boundary node, grouping the digital inputs associated to said boundary node into an input set;
   ii) for each input set, grouping the boundary nodes associated with any input in the input set into a set of associated boundary nodes;
   iii) for each set of associated boundary nodes, identifying inputs which are associated to any boundary node in the set of associated boundary nodes and merging all input sets which comprise said inputs;
   iv) repeating step ii) and iii) until the input sets and the sets of boundary node stop growing.

21. The method of claim 1 wherein the method further comprises
   for each boundary node, interrogating the data structure to find dependent analog nodes which are dependent on said boundary node.

22. The method of claim 1 wherein analyzing the behavior of the analog circuit comprises identifying critical nodes.

23. The method of claim 22 wherein the method further comprises
   identifying untested critical nodes in the circuit;
   identifying sets of interacting nodes among the untested critical nodes;
   for each set of interacting nodes, back-traversing the data structure from the interacting nodes in the set of interacting nodes to the digital inputs and creating new input sets; and
   analyzing the behavior of the analog circuit by successively analyzing each new input sets for all possible combinations of input states within that set.

24. The method of claim 22 wherein the critical nodes comprise problematic floating nodes.

25. The method of claim 24 wherein
   the input circuit design further comprises a list of supply connected nodes;
   a node is identified as a floating node if it is not coupled with any supply connected node; and
   a floating node is identified as problematic if it can provide a leakage path.

26. The method of claim 1 wherein one circuit component is represented by a plurality of edges where each of the edges represents a different control path through the component.

27. A computer system comprising a module configured as an automated circuit analysis tool for analyzing the behavior of an analog circuit; wherein:
   the analog circuit is controllable by a plurality of digital inputs, each digital input being togglable between two or more input states;
   the analog circuit is represented by a data structure comprising a graph comprising a plurality of nodes connected via edges, each node of the graph representing a node of the analog circuit, each edge of the graph representing a circuit component, and the data structure being traversable across all connected nodes; and
   the automated circuit analysis tool is configured to:
      i) identify a set of boundary nodes in the data structure which are at a digital-analog boundary of the data structure;
      ii) for each digital input, identify associated boundary nodes which are coupled with the digital input;
      iii) group digital inputs into input sets, where each of the different input sets are coupled with mutually exclusive sets of associated boundary nodes; and
      iv) analyze the behavior of the analog circuit by successively analyzing one or more of the input sets for all possible combinations of inputs states within that set.

* * * * *